United States Patent [19]

Parker

[11] Patent Number: 4,789,787
[45] Date of Patent: Dec. 6, 1988

[54] WIEN FILTER DESIGN

[75] Inventor: Norman W. Parker, Westlake Village, Calif.

[73] Assignee: MicroBeam Inc., Newbury Park, Calif.

[21] Appl. No.: 55,414

[22] Filed: May 27, 1987

[51] Int. Cl.[4] .......................... H01J 3/14; G21K 1/08; B01D 59/44
[52] U.S. Cl. ............................. 250/396 ML; 250/296
[58] Field of Search ........... 250/396 R, 396 ML, 296; 313/361.1

[56] References Cited

U.S. PATENT DOCUMENTS

| | | | |
|---|---|---|---|
| 3,194,961 | 7/1965 | Ewald et al. | 250/296 |
| 3,816,748 | 6/1974 | Harrison | 250/296 |
| 3,979,590 | 9/1976 | Andersen | 250/305 |
| 4,019,989 | 4/1977 | Hazewindus et al. | 250/396 ML |
| 4,362,945 | 12/1982 | Riecke | 250/396 ML |
| 4,697,086 | 9/1987 | Ishitani et al. | 250/396 R |

*Primary Examiner*—Bruce C. Anderson
*Attorney, Agent, or Firm*—Lyon & Lyon

[57] ABSTRACT

A Wien filter for use in charged particle beam systems is disclosed, having two opposed resistive magnetic pole pieces separated from a set of excitation coils by an electrically insulating material. Two opposed electric pole pieces are positioned in orthogonal relationship to and in physical contact with the magnetic pole pieces to form a physical aperture through which the charged particles will pass. The resistivity of the magnetic pole pieces is such that sufficient current will flow through them between the electric pole pieces to establish a uniform electric field over the entire physical aperture.

15 Claims, 5 Drawing Sheets

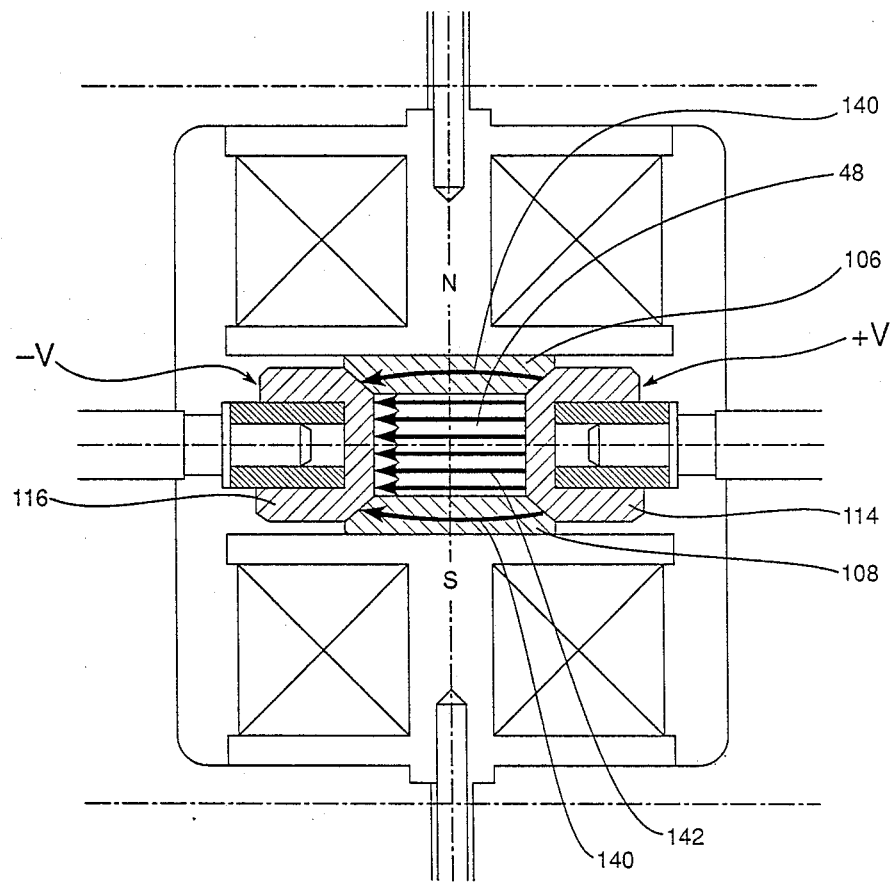
FIGURE 4B. ELECTRIC FIELD LINES AND CURRENTS IN POLE PIECES

WIEN FILTER DESIGN

BACKGROUND OF THE INVENTION

1. Field Of The Invention

The present invention relates to the design of an improved Wien filter for all applications, including use as a velocity filter for identical mass particles or as a mass filter for a beam with a range of particle masses.

2. The Prior Art

Velocity or mass filters using crossed electric and magnetic fields ("Wien filters") are known in the art. Early references, including Herzog, R. (1934) Z. Phys. Vol. 89, p. 447, and Henneberg, W. (1934) Ann. Phys. Vol. 19 (5), p. 335 relate to the use of a Wien filter for acquiring energy spectra of electrons, where the filter is acting as a velocity spectrometer. Ogilvie, K. W., Kittridge, R. J., and Wilkerson, T. D. (1968) Rev. Sci. Instrum. Vol. 39, p. 459 relates to the Wien filter for analysis of heavy particles. Seliger, R. L. (1972) J. Appl. Phys. Vol. 43, p. 2352 considers the Wien filter for use in mass spectrometry.

In all applications, the size of the usable aperture in the mass (velocity) filter is important. Particles passing through currently known Wien filters outside the usable aperture (but still within the physical aperture) will be subject to aberrations which limit the performance attainable with the Wien filter in either the velocity or mass filter operating modes.

BRIEF DESCRIPTION OF THE INVENTION

The present invention is an improvement in the design of Wien filters utilizing crossed electric and magnetic fields. The physical aperture of a Wien filter is defined as the space bounded by the magnetic and electric pole pieces. The usable aperture of a Wien filter is the area within the physical aperture through which the ion beam may pass and still undergo the desired mass (velocity) separation. In the prior art, the design of the magnetic and electric pole pieces restricts the usable aperture to a small fraction of the actual physical aperture. The present invention is an improvement in the design of the magnetic and electric pole pieces which increases the usable aperture to approximately the size of the physical aperture.

The major components of the invention include two magnetic pole pieces fabricated from a low electrical conductivity magnetic material, such as ferrite. These pole pieces are located opposite one another on each side of the physical aperture of the device.

The present invention also includes two electric pole pieces designed to be mounted opposite one another and in contact with the edges of the magnetic pole pieces, so that an electrical current may flow through the magnetic pole pieces from one electric pole piece to the other. These electric pole pieces are mounted perpendicularly to the magnetic pole pieces, on opposite sides of the physical aperture of the device. Two coils for exciting a magnetic field between the magnetic pole pieces, across the physical aperture, are located adjacent to the pole pieces and are insulated therefrom.

Wires for conducting the required voltages to the electric pole pieces and the required currents to the magnetic field coils, are electrically connected to those members.

A magnetic housing and mounting structure holds the coils, magnetic pole pieces, and electric pole pieces in a rigid structure.

The present invention greatly increases the transmission of charged particles through the ExB Wien filter by increasing the usable entrance aperture as a fraction of the physical aperture. This is an important advantage for applications such as photomask repair using a focused ion beam instrument, since the increased transmission raises the signal-to-noise ratio, allowing faster and/or better imaging, and improvements in endpoint detection during sputer-removal processes.

DETAILED DESCRIPTION OF A PREFERRED EMBODIMENT

Figure 1:
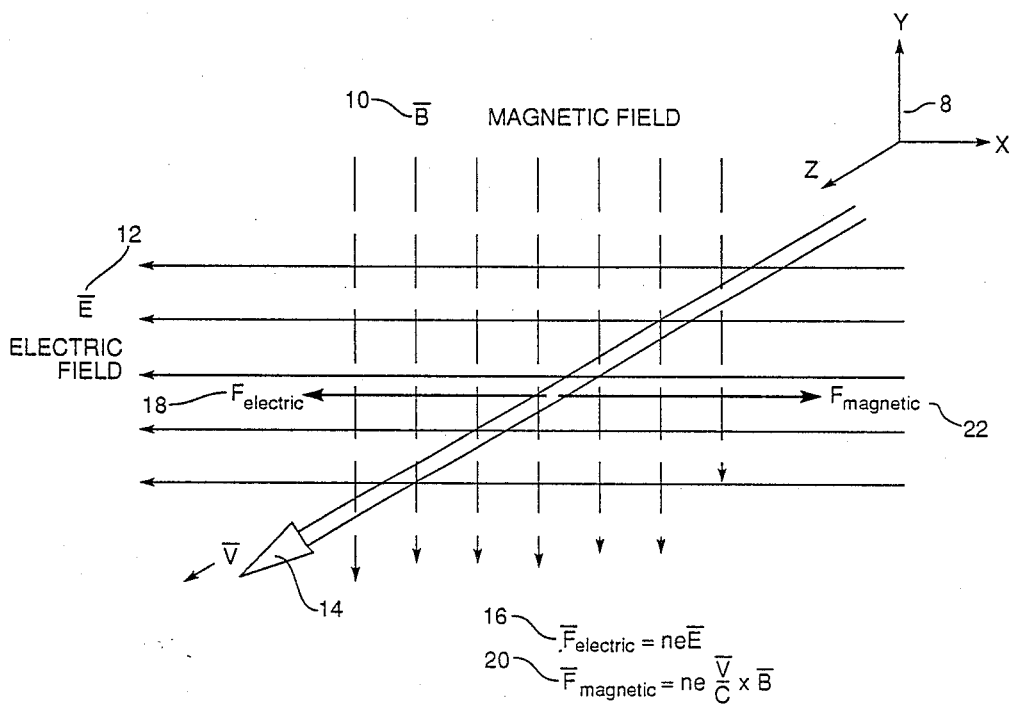
FIG. 1 is a description of the operating principle of Wien filters.

FIG. 1 illustrates the operating principle of the Wien filter. This type of mass (velocity) filter uses crossed electric and magnetic fields to exert opposing forces on charged particles passing through the filter. An X-Y-Z orthogonal coordinate system 8 is shown. A homogeneous magnetic field 10 of magnitude B is directed parallel to the Y-axis in the negative direction. A homogeneous electric field 12 of magnitude E is directed parallel to the X-axis, also in the negative direction. A beam of charged particles 14 is directed initially (before encountering fields 10 and 12) parallel to the Z-axis, in the positive direction and through the electric and magnetic fields. The fields 10 and 12 are positioned in space such that along trajectory 14, the magnitudes of fields 10 and 12 are always in the same proportion, rising from initial values of 0 Gauss (G) and 0 Volts/centimeter (V/cm) to some well-defined maximum values, then decreasing back to 0 G and 0 V/cm again. Fields 10 and 12 apply forces to the beam of particles 14. Equation 16 expresses the force on beam 14 due to electric field 12. Note that this force is in the $-X$ direction for positive $(+)$ particles as shown by force vector 18 in FIG. 1.

When a Wien filter is used for velocity separation, the preceeding description of the magnetic and electric forces on beam 14 still applies. Suppose it is desired to transmit only charged particles (for example, electrons) with a narrow range of velocities (delta v) centered around v(center). Then, $$\text{(delta v)}/\text{v (center)} << 1. \tag{eq. I}$$

Now setting the ratio of the magnetic and electric field strengths according to $$E/B = v(\text{center})/c \tag{eq. J}$$

charged particles of velocity v(center) will pass through the Wien filter undeflected. Slightly slower particles [v<v(center)] feel a small net force since electric force 18 slightly exceeds magnetic force 22. Slightly faster particles [v>v(center)] feel a small net force in the opposite direction since magnetic force 22 slightly exceeds electric force 18. Charged particles of all velocities $<>$ v(center) are deflected away from the Z-axis in a direction parallel to the X-axis at an angle proportional to the strength of the magnetic field, B.

If a velocity separation aperture is placed on the Z-axis at a position in the +Z-direction from the electric and magnetic fields, charged particle beam 14 will encounter it after passing through the Wien filter. When the ratio of the strengths of the electric and magnetic fields is set according to eq. J, only charged particles with the velocity v(center) are transmitted through the Wien filter. If the magnetic field 10 is sufficiently strong, particles outside the desired velocity range (delta v from v(center)) will be deflected off the Z-axis far enough that they do not pass through the velocity separation aperture. The operation of a Wien filter used for velocity separation is generally understood by those skilled in the art.

Equation 20 expresses the force on beam 14 due to magnetic field 10. Note that this force is proportional to the vector cross-product of the velocity v of each charged particle in beam 14 and the strength, B, of magnetic field 10. For the incident beam 14, where v is initially in the +Z-direction and B is in the −Y-direction, this cross-product gives a force in the +X-direction, shown as force vector 22 in FIG. 1. Both force vectors 18 and 22 are proportional to the ion charge ne (where e=the fundamental charge $1.60209 \times 10^{-19}$ Coulombs, and n=net total charge on the ion in units of e), thus the ratio of the two forces is independent of the particle charge:

$$F(\text{magnetic})/F(\text{electric}) = [(v/c)B]/E \quad (\text{eq. A})$$

If force vectors 18 and 22 are equal in magnitude, exact cancellation occurs since they point in opposite directions parallel to the X-axis. This equality occurs if (eq. A)=1, i.e., $$E/B = v/c \quad (\text{eq. B})$$

Thus if beam 14 has a velocity v satisfying $$v = c \, (E/B) \quad (\text{eq. C})$$

where
c=the speed of light=$2.997925 \times 10^{10}$ cm/sec,
the beam will pass through the Wien filter undefleted from its initial direction, emerging from the filter travelling parallel to the Z-axis in the positive direction. If the beam of particles 14 has a narrow spread in velocities (delta v) relative to its average velocity v(average), $$(\text{delta } v)/v(\text{average}) << 1 \quad (\text{eq. D})$$

and if the strengths of the electric field 12, E, and the magnetic field 10, B, are chosen such that $$E/B = v(\text{average})/c \quad (\text{eq. E})$$

then the beam will undergo a small amount of spreading due to its transit through the mass filter. This spreading arises because slightly slower ions [v<v(average)] feel a small net force since electric force 18 slightly exceeds magnetic force 22. Slightly faster ions [v>v(average)] feel a small net force in the opposite direction since magnetic force 22 slightly exceeds electric force 18.

Assume beam 14 contains a distribution of charged particle species, having different masses m(i), i=1, ..., N, (N=number of different species), but having the same average energy, E(average). Then for each species i, $$v(i) = \text{SQRT} \, [2 \, E(\text{average})/m(i)] \quad (\text{eq. F})$$

assuming a non-relativistic beam energy. Eq. F shows that the various species i, of differing masses m(i), will have differing velocities v(i). If we also require that the range of ion energies (delta E) is narrow:

$$(\text{delta } E)/E(\text{average}) << 1 \quad (\text{eq. G})$$

then Eq. D is satisfied. Now, setting $$E/B = \text{SQRT} \, [2 \, E(\text{average})/m(j)]/c \quad (\text{eq. H})$$

then particles of species j ($1 \leq j \leq N$), will pass through the crossed electric and magnetic fields undeflected. All other species i ($i <> j$, $1 \leq i \leq N$) will be deflected away from the Z-axis in a direction parallel to the X-axis.

If a mass separation aperture is placed on the Z-axis at a position in the +Z-direction from the electric and magnetic fields, charged particle beam 14 will encounter it after passing through the Wien filter. When the ratio of the strengths of the electric and magnetic fields is set according to eq. H, only species j will pass through the Wien filter undeflected. If the magnetic field 10 is sufficiently strong, all other species i ($i <> j$, $1 \leq i \leq N$) will be deflected off the Z-axis far enough that they do not pass through the mass separation aperture. The operation of a Wien filter used for mass separation is generally understood by those skilled in the art.

Figure 2A:
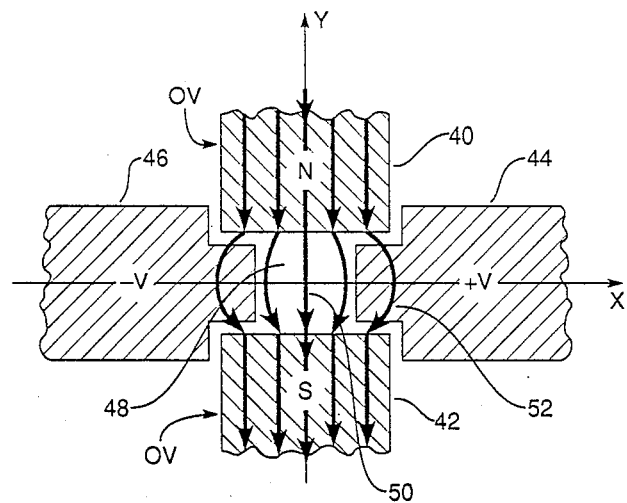
FIG. 2(a–b) describes the operation of the prior art Wien filters

FIG. 2a shows a typical prior art design for the magnetic field pole pieces 40 and 42, and electric field pole pieces 44 and 46, of a Wien filter. In FIG. 2a, the magnetic field lines are shown as they extend through the magnetic material of pole pieces 40 and 42, and between them in the space 48, through which beam 14 passes. The magnetic poles and electric poles are designed to fit together as shown. Generally in the prior art, pole pieces 40 and 42 are fabricated from magnetic materials such as soft iron or mu-metal, both of which are good electrical conductors. Their potentials are set at 0V as shown. Because they are good conductors, they cannot be in contact with electric pole pieces 44 and 46, which are at voltages +V and −V, respectively. This restricts the allowable width of pole pieces 40 and 42. Magnetic field lines 50, along the symmetry plane, are straight, as desired. Near the edges, field lines 52 bulge out as shown, due to the natural repulsion between field lines. Thus, near the edges of space 48, the magnetic field is no longer oriented parallel to the Y-axis, violating the requirements given above for FIG. 1.

Figure 2B:
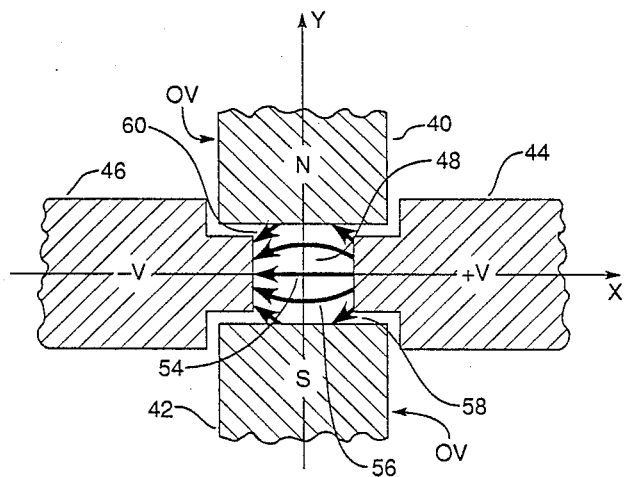

FIG. 2b shows the electric field lines which result when voltages +V and −V are applied to electric pole pieces 44 and 46, respectively. Because of the limitations described with respect to FIG. 2a, the width of these pole pieces is also limited by the constraint of different voltages. Electric field lines 54, along the symmetry plane, are straight, as desired. Moving away from the symmetry plane, electric field lines 56 bulge outward, again due to the repulsion between field lines. Farther out from the symmetry plane, field lines 58, which start at electric pole piece 44, terminate on magnetic pole pieces 40 or 42, instead of going from pole piece 44 to pole piece 46. Other field lines 60 go from pole pieces 40 or 42 to pole piece 46. Thus, near the edges of space 48, the electric field is no longer oriented parallel to the X-axis, violating the requirements given for FIG. 1.

Because the magnetic and electric field lines are incorrect near the edges of space 48, the Wien filter functions improperly for beams 14 which pass through the filter near any of the electric or magnetic pole pieces. This generally limits the usable aperture of the Wien filter to a small fraction of the physical aperture, corresponding to space 48.

Figure 3A:
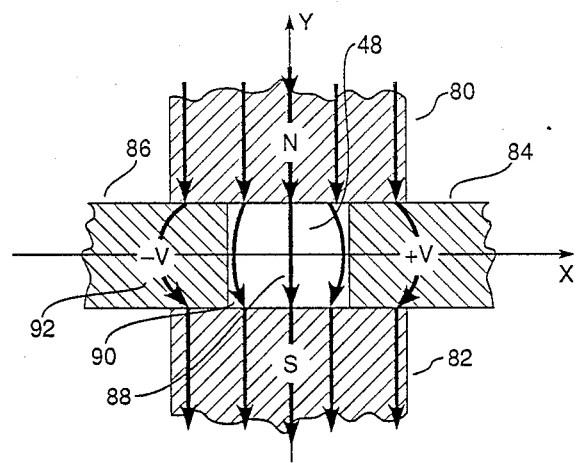
FIG. 3(a–b) describes the operation of a Wien filter embodying the present invention.

FIG. 3a shows the improved design for the magnetic and electric pole pieces implemented in the present invention. Magnetic pole pieces 40 and 42 in FIG. 2 (which were electrically conducting), are replaced with magnetic pole pieces 80 and 82, fabricated using a magnetic material, such as ferrite which is a relatively poor electrical conductor. Magnetic pole pieces 80 and 82 are in electrical contact with electric pole pieces 84 and 86. All prior art restrictions against contact between these pole pieces are now removed, since magnetic pole pieces 80 and 82 are electrically insulated from ground and cannot short the electric pole pieces together. With these restrictions removed, pole pieces 80 and 82 can be made much wider, as shown. Magnetic field lines 88 are on the symmetry axis and are straight, as desired. Magnetic field lines 90 are also almost straight, since the wider magnetic pole pieces 80 and 82 prevent bulging of the field lines except near the edge, as shown for field lines 92, which are outside space 48. Thus, within space 48, all magnetic field lines generally satisfy the requirement from FIG. 1 for parallelism with the Y-axis.

Figure 3B:
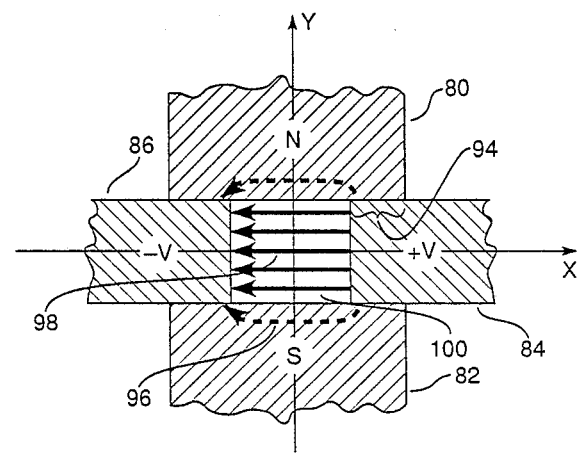

FIG. 3b shows the electric field lines resulting when voltages +V and −V are applied to electric pole pieces 84 and 86, respectively. Magnetic pole piece 80 is in electrical contact with electric pole piece 84 over area 94. A conductive coating on this part of pole piece 80 facilitates making good contact. Similar connections are made at the other three contacts of pole pieces 80 and 82 with pole pieces 84 and 86. Now, when voltages are applied to the electric pole pieces, a current 96 flows through the magnetic pole pieces 80 and 82, parallel to the X-axis, as shown. This current flow induces a linear voltage gradient across the inner surface (side facing space 48) of pole pieces 80 and 82. Electric field line 98 is on the symmetry plane and is straight as desired. Electric field line 100 is near the surface of pole piece 82. In the prior art, as shown in FIG. 2, this field line would be distorted away from parallelism with the X-axis. In the present invention, however, the linear voltage gradient induced by current 96 causes electric field line 100 to remain parallel with the X-axis, as required by the discussion in FIG. 1. The electrical resistivity of the magnetic material in pole pieces 80 and 82 must be chosen to allow sufficient current 96 to establish a proper voltage gradient, while not enough current to dissipate excessive heat. Generally, current 96 should exceed the expected maximum value of the current in beam 14 by several orders of magnitude to avoid problems with scattered charged particles perturbing the desired linear voltage gradient.

Because the magnetic and electric fields are both correct over essentially the entire space 48 in the present invention, the usable aperture is now roughly equivalent to the physical aperture, space 48.

Figure 4A:
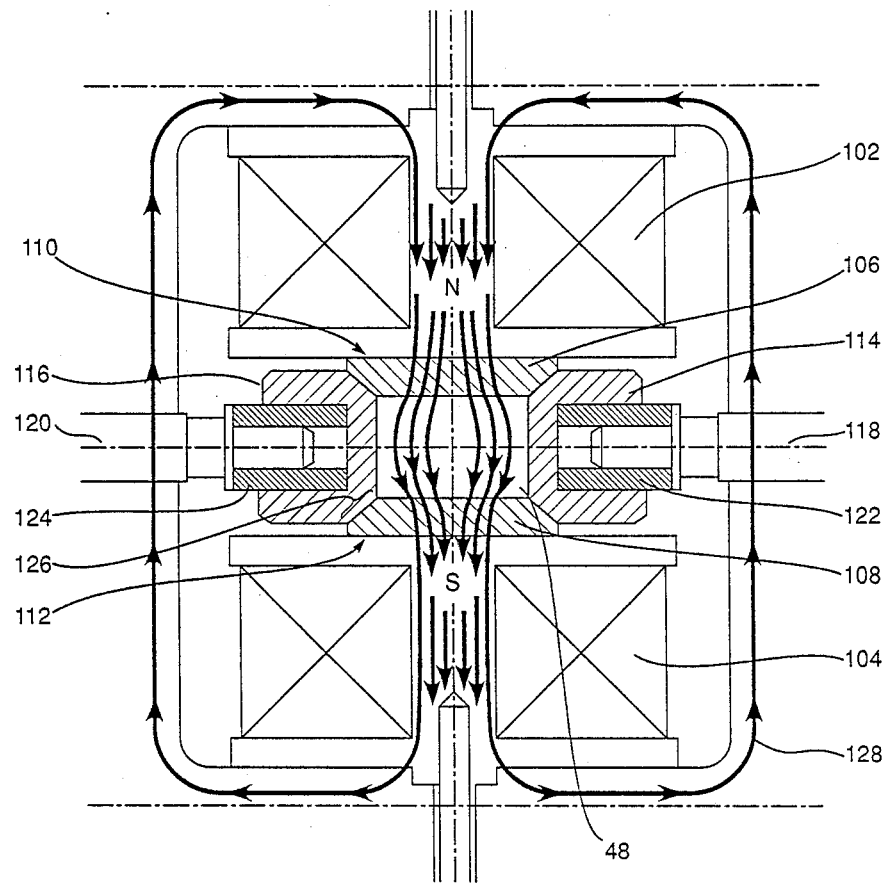
FIG. 4(a–b) shows a preferred embodiment of the present invention.

FIG. 4a shows a preferred embodiment of a Wien filter employing the improved pole piece design described in FIG. 3. This is a cross-sectional view in the X-Y plane, in which beam 14 would be emerging from the plane of the figure. Currents are applied to coils 102 and 104 to excite a magnetic field between pole pieces 106 and 108. In a preferred embodiment, 106 and 108 are fabricated from ferrite with an electrical resistivity in the range $1 \times 10^6$ to $1 \times 10^8$ ohm-cm. The magnetic field distribution between 106 and 108 is shown. As shown in FIG. 3, both 106 and 108 are electrically insulated by thin layers of an insulating material, for example, Kapton or Mylar, at surfaces 110 and 112, respectively. Electric pole pieces 114 and 116 are fabricated using a vacuum-compatible electrically-conducting non-magnetic material such as 304 stainless steel. Mounting screws 118 and 120 press on insulators 122 and 124 to hold pole pieces 114 and 116 in place. Wires (not shown) are connected to each of 114 and 116 to conduct the voltages +V and −V, respectively. The preferred embodiment illustrates a wedged design in which electrcc pole pieces 114 and 116 press against surfaces 126 of the magnetic pole pieces 106 and 108. This facilitates good electrical contact as well as forcing pole pieces 106 and 108 to stay in place against insulators 110 and 112. Magnetic flux lines 128 flow within the outer housing of the Wien filter, generally fabricated from standard magnetic materials such as soft iron or mu-metal.

FIG. 4b shows the same cross-sectional view as in FIG. 4a, now illustrating the electric fields arising due to voltages +V and −V being applied to pole pieces 114 and 116, respectively. Currents 140 flow between electric pole pieces 114 and 116, passing through magnetic pole pieces 106 and 108. The electric field lines in space 48 are essentially all parallel to the X-axis, as required by the discussion in FIG. 1.

FIGS. 4a and 4b show that over the full physical aperture 48 the electric field and magnetic field satisfy the directional requirements for proper mass (velocity) separation, discussed in FIG. 1.

Table I gives the physical design parameters for an embodiment of the present invention shown in FIG. 4.

TABLE I

| Design Parameters | |
|---|---|
| Electric Pole Pieces | |
| material | 304 stainless steel |
| length along ion trajectory | 80 mm |
| width across physical aperture | 8 mm |
| Magnetic Pole Pieces | |
| material | ferrite |
| resistivity | 1 to 100 Mohm-cm |
| length along ion trajectory | 80 mm |
| width across physical aperture | 15 mm |
| thickness | 3 mm |
| Magnetic Coils | |
| material | soft iron |
| number of turns | 360/side (2 sides) |
| gauge wire | 23 AWG |
| resistance | 3.7 ohms/side |
| Outer Housing | |
| material | soft iron |
| diameter | 82.5 mm |

While a preferred embodiment has been disclosed herein, and illustrative design parameters have been given in Table 1, those of ordinary skill in the art will readily appreciate how to scale or otherwise modify the disclosure herein without departing from the spirit of the invention, which is to be limited only by the appended claims.

What is claimed is:

1. A wien filter, including:

two spaced-apart electric pole pieces having generally parallel opposing faces, two spaced-apart opposed magnetic pole pieces in physical contact with said electric pole pieces such that said magnetic pole pieces and said electric pole pieces form interfaces and define a generally rectangular physical aperture, said magnetic pole pieces having a resistivity such that a current will flow through them between said electric pole pieces sufficient to establish a uniform electric field across said physical aperture, two excitation coils, one associated with each of said magnetic pole pieces, each of said excitation coils separated from its respective magnetic pole piece by a layer of electrically insulating material.

2. The wien filter of claim 1, further including conductive coatings on said magnetic pole pieces at the regions of said interfaces.

3. The wien filter of claim 1, wherein said magnetic pole piece members have a resistivity in the range of from about $1 \times 10^6$ to $1 \times 10^8$ ohm-cm.

4. The wien filter of claim 1, wherein said magnetic pole piece members are made from ferrite.

5. The wien filter of claim 1, wherein said magnetic pole piece members are made from ferrite and said electric pole pieces are made from stainless steel.

6. A wien filter, including:
a pair of non-magnetic, spaced-apart opposing electric pole pieces having faces in a substantially parallel relationship to one another,
a pair of spaced-apart opposing magnetic pole pieces disposed in an orthogonal relationship to said pair of electric pole pieces and sandwiching and in physical contact with said electric pole pieces to form interfaces and define a physical aperture, said magnetic pole pieces having a resistivity such that a current will flow through each one of them between said electric pole pieces sufficient to establish a uniform electric field across said physical aperture,
two excitation coils, one associated with each of said magnetic pole pieces, each of said excitation coils separated from its respective magnetic pole piece by a layer of electrically insulating material.

7. The wien filter of claim 6, further including conductive coatings on said magnetic pole pieces at the regions of said interfaces.

8. The wien filter of claim 6, wherein the resistivity of said magnetic pole pieces is in the range of from about $1 \times 10^6$ to $1 \times 10^8$ ohm-cm.

9. The wien filter of claim 6, wherein said magnetic pole pieces are made from ferrite.

10. The wien filter of claim 6, wherein said magnetic pole pieces are made from ferrite and said electric pole pieces are made from stainless steel.

11. A wien filter, including:
a pair of non-magnetic, spaced-apart, opposing electric pole pieces having faces in a substantially parallel relationship to one another, said faces having beveled edges,
a pair of spaced-apart opposed magnetic pole pieces having faces in a substantially parallel relationship with one another, said faces having beveled edges, said magnetic pole pieces disposed in an orthogonal relationship to said pair of electric pole pieces such that the beveled edges of said electric pole pieces are in physical contact with the beveled edges of said magnetic pole piece to form interfaces and define a physical aperture, said magnetic pole pieces having a resistivity such that current will flow through each of them between said electric pole pieces sufficient to establish a uniform electric field over said physical aperture,
two excitation coils, one associated with each of said magnetic pole pieces, each of said excitation coils separated from its respective magnetic pole piece by a layer of electrically insulating material.

12. The wien filter of claim 11, further including conductive coatings on said magnetic pole pieces at the regions of said interfaces.

13. The wien filter of claim 11, wherein the resistivity of said magnetic pole pieces is in the range of from about $1 \times 10^6$ to $1 \times 10^8$ ohm-cm.

14. The wien filter of claim 11, wherein said magnetic pole pieces are made from ferrite.

15. The wien filter of claim 11, wherein said magnetic pole pieces are made from ferrite and said electric pole pieces are made from stainless steel.

* * * * *